(12) United States Patent
Heid et al.

(10) Patent No.: US 6,906,520 B2
(45) Date of Patent: Jun. 14, 2005

(54) METHOD FOR COMMUNICATING A MAGNETIC RESONANCE SIGNAL, AND RECEPTION ARRANGEMENT AND MAGNETIC RESONANCE SYSTEM OPERABLE IN ACCORD THEREWITH

(75) Inventors: Oliver Heid, Gunzenhausen (DE); Markus Vester, Nuremberg (DE)

(73) Assignee: Siemens Aktiengesellschaft, Münich (DE)

(*) Notice: Subject to any disclaimer, the term of this patent is extended or adjusted under 35 U.S.C. 154(b) by 0 days.

(21) Appl. No.: 10/428,229

(22) Filed: May 2, 2003

(65) Prior Publication Data

US 2003/0227289 A1 Dec. 11, 2003

(30) Foreign Application Priority Data

May 2, 2002 (DE) .......................................... 102 19 749

(51) Int. Cl.[7] ................................................ G01V 3/00
(52) U.S. Cl. ........................................ 324/322; 324/318
(58) Field of Search .............................. 324/322, 318, 324/309, 307, 314; 600/410, 411

(56) References Cited

U.S. PATENT DOCUMENTS 5,245,288 A    9/1993  Leussier
5,384,536 A  * 1/1995  Murakami et al. .......... 324/309
5,666,055 A  * 9/1997  Jones et al. ................. 324/318
6,704,592 B1 * 3/2004  Reynolds et al. ........... 600/411

OTHER PUBLICATIONS

"High Frequency Circuit Design" by James Hardy Reston Publishing Company, pp. 311–312.*

"Principles of Communication Systems" by Taub et al. McGraw–Hill, pp. 94–95.*

"Dioden und Transistoren," Lehmann (1969), pp. 46–47.

* cited by examiner

Primary Examiner—Louis Arana
(74) Attorney, Agent, or Firm—Schiff Hardin LLP

(57) ABSTRACT

In a communication method for a magnetic resonance signal and a reception arrangement and magnetic resonance system corresponding therewith, a non-linear reactance is supplied with a magnetic resonance signal by a magnetic resonance reception antenna and with auxiliary energy by an auxiliary reception antenna. The auxiliary energy is emitted by an auxiliary transmission antenna. The non-linear reactance mixes the auxiliary energy and the magnetic resonance signal to form a mixed signal with a sum frequency and supplies it to a mixed signal transmission antenna. The latter emits at the mixed frequency. A mixed signal reception antenna receives the mixed signal and supplies it to an evaluation device.

15 Claims, 2 Drawing Sheets

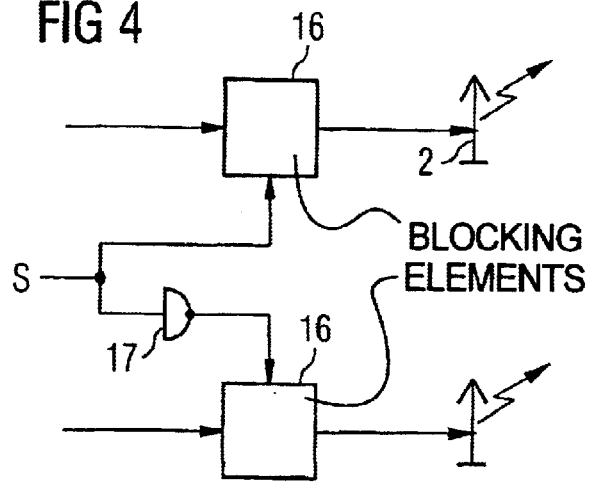
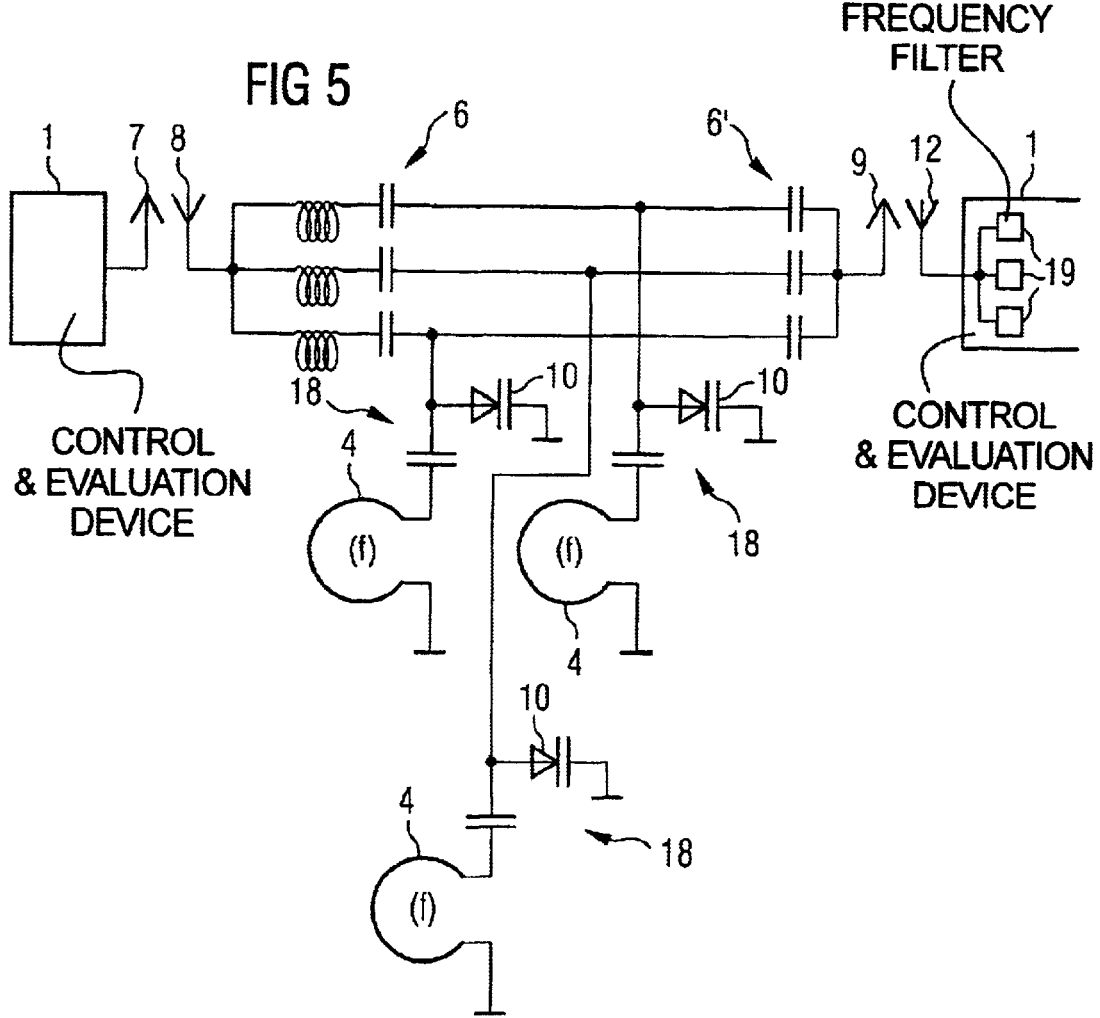

METHOD FOR COMMUNICATING A MAGNETIC RESONANCE SIGNAL, AND RECEPTION ARRANGEMENT AND MAGNETIC RESONANCE SYSTEM OPERABLE IN ACCORD THEREWITH

BACKGROUND OF THE INVENTION

1. Field of the Invention

The present invention is directed to a communication method for a magnetic resonance signal from a magnetic resonance reception antenna to an evaluation device, as well as to a reception arrangement for a magnetic resonance signal that is suitable for the implementation of this method, and to a corresponding magnetic resonance system.

2. Description of the Prior Art

Because of the signal-to-noise ratio that can be obtained, it is advantageous in magnetic resonance systems to employ local or surface coils. Such coils are usually connected by a cable to an evaluation device. The cable and the required plug connections, however, represent a limitation on the ease of operation and on the dependability of the surface coil and the corresponding signal transmission.

It is also known to convert a received magnetic resonance signal to a different frequency and to transmit it wirelessly to the evaluation device. Auxiliary energy sources (for example, batteries or accumulators) and radiofrequency oscillators are required for this purpose in the known systems.

For example, German OS 41 26 537 discloses an example of such a system. This published application discloses a communication method for a magnetic resonance signal from a magnetic resonance reception antenna to an evaluation device wherein an auxiliary transmission antenna emits auxiliary energy at an auxiliary frequency, and some of the auxiliary energy is received by an auxiliary reception antenna. The auxiliary signal (or, the received part of the auxiliary signal) is mixed with a magnetic resonance signal received from the magnetic resonance reception antenna to form a mixed signal with a mixed frequency that is equal to the sum of the magnetic resonance frequency and the auxiliary frequency. The mixed signal is broadcast with the mixed frequency by a mixed signal reception antenna.

SUMMARY OF THE INVENTION

An object of the present invention is to provide a communication method for a magnetic resonance signal, and a reception arrangement and a magnetic resonance system operable in accordance with the method, with which a wireless communication of the magnetic resonance signal to the evaluation device is possible without energy sources and oscillators being structurally allocated to the reception arrangement.

This object is achieved in a communication method in accordance with the invention wherein the magnetic resonance signal is received by the magnetic resonance reception antenna with a magnetic resonance frequency and is supplied to a non-linear reactance, an auxiliary transmission antenna emits auxiliary energy at at least one auxiliary frequency, a part of the auxiliary energy is received by an auxiliary reception antenna and is supplied to the non-linear reactance at the auxiliary frequency, the non-linear reactance mixes the auxiliary energy supplied to it and the magnetic resonance signal supplied to it to form a mixed signal with a mixed frequency, equal to the sum of the magnetic resonance frequency and the auxiliary frequency, and supplies the mixed signal to a mixed signal transmission antenna, the mixed signal transmission antenna emits at least the mixed signal, and at least a part of the mixed signal is received by a mixed signal reception antenna is supplied to an evaluation device.

Corresponding therewith, the above object is achieved in a reception arrangement for a magnetic resonance signal in accordance with the invention having a mixer arrangement composed of a non-linear reactance and a magnetic resonance reception antenna, an auxiliary reception antenna and a mixed signal transmission antenna, and wherein the magnetic resonance signal is received at a magnetic resonance frequency by the magnetic resonance reception antenna and is supplied to the non-linear reactance, and wherein auxiliary energy is received at at least one auxiliary frequency by the auxiliary reception antenna and is supplied to the non-linear reactance at the auxiliary frequency, and wherein the non-linear reactance mixes the auxiliary energy supplied to it and the magnetic resonance signal supplied to it to form a mixed signal with a mixed frequency, equal to the sum of the magnetic resonance frequency and the auxiliary frequency, and this mixed signal is supplied to a mixed signal transmission antenna, and wherein the mixed signal transmission antenna emits at least the mixed signal.

The above object also is achieved in a magnetic resonance system in accordance with the invention having at least one auxiliary transmission antenna with which auxiliary energy is emitted at at least one auxiliary frequency, at least one above-described reception arrangement, at least one mixed signal reception antenna that receives at least a part of the mixed signal, and an evaluation device to which the part of the mixed signal received by the mixed signal reception antenna is supplied and with which the magnetic resonance signal is evaluated.

In an embodiment the non-linear reactance generates a supplemental signal at a supplemental frequency that is equal to the difference between the auxiliary frequency and the magnetic resonance frequency, and the supplemental signal is supplied to an acceptor circuit that is resonant at the supplemental frequency. A higher emitted energy thus is achieved at the mixed frequency. The acceptor circuit, for example, can be connected in parallel with the non-linear reactance.

The energy emitted by the mixed signal transmission antenna becomes higher the more the auxiliary frequency deviates from the magnetic resonance frequency. It is therefore preferably substantially larger than the magnetic resonance frequency. In particular, it should be at least three times, preferably at least five times, the magnetic resonance frequency. Values between ten and fifteen times the magnetic resonance frequency are most preferred.

In a further embodiment a detector device tunes the magnetic resonance reception antenna to the magnetic resonance frequency only when auxiliary energy is received from the auxiliary reception antenna. This allows the resonant behavior to be varied dependent on whether an examination subject is excited to magnetic resonance or whether the magnetic resonances that have already been excited are measured, by not transmitting the auxiliary energy during the excitation of magnetic resonances. This procedure is especially operationally dependable when the magnetic resonance system also has a magnetic resonance transmission antenna with which a magnetic resonance excitation signal at the magnetic resonance frequency is emitted and when the magnetic resonance transmission antenna and the auxiliary transmission antenna are locked relative to one another.

The magnetic resonance reception antenna, the auxiliary reception antenna and the mixed signal transmission antenna preferably are fashioned as parallel resonant circuits and are connected in series with one another or are fashioned as series resonant circuits and are connected in parallel. Other embodiments are also possible.

The non-linear reactance preferably is connected in parallel with the series or parallel circuit of the antennas. In particular, it can be fashioned as a varactor, i.e. a capacitance diode.

DESCRIPTION OF THE DRAWINGS

FIG. 4 illustrates two transmission antennas that are locked to one another in accordance with the invention.

FIG. 5 schematically illustrates a further embodiment of a magnetic resonance system in accordance with the invention.

DESCRIPTION OF THE PREFERRED EMBODIMENTS

Figure 1:
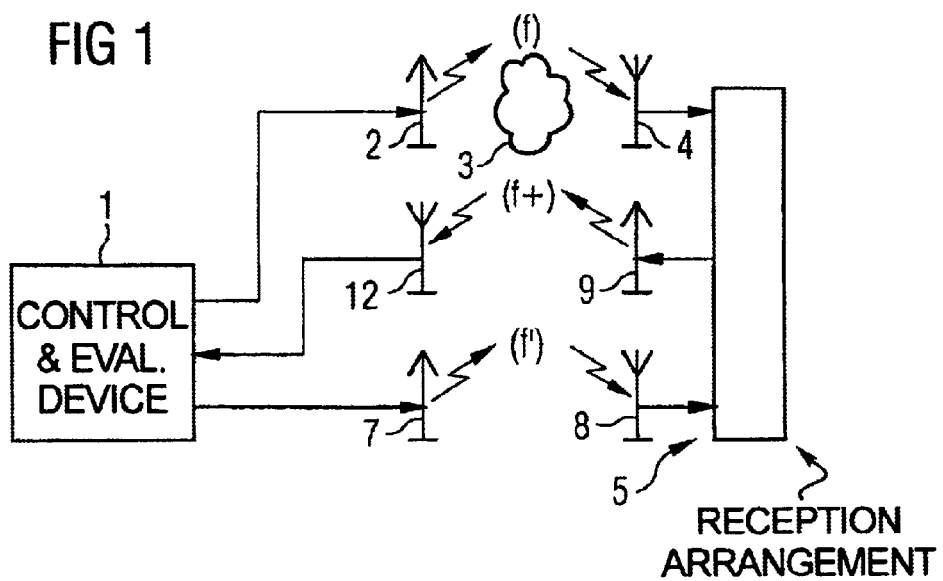
FIG. 1 is a schematic illustration of a magnetic resonance system operable in accordance with the present invention.
Figure 2:
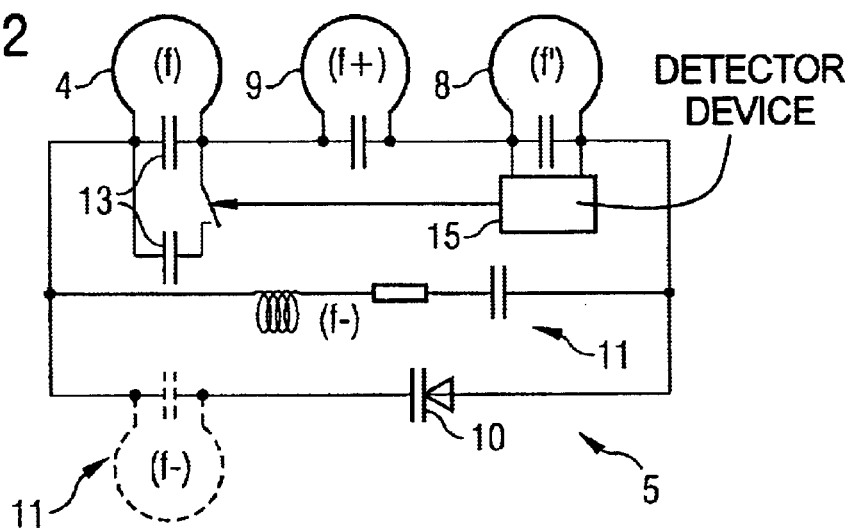
FIGS. 2 and 3 show different embodiments of reception arrangements operable in accordance with the invention.

As shown in FIGS. 1 and 2, a magnetic resonance system has a control and evaluation device 1. Among other things, the control and evaluation device 1 drives a magnetic resonance transmission antenna 2, so that it emits a magnetic resonance excitation signal with a magnetic resonance frequency f. Nuclear spins in an examination subject 3 (for example, a human) are excited to a resonant condition on the basis of the magnetic resonance excitation signal.

After the excitation of the spins of the examination subject 3 is complete, a magnetic resonance reception antenna 4 of a reception arrangement 5 receives a magnetic resonance signal. The received magnetic resonance signal likewise is at the magnetic resonance frequency f. The magnetic resonance reception antenna 4 forwards the received magnetic resonance signal to a non-linear reactance 10 unmodified, i.e., unamplified.

The magnetic resonance system also has an auxiliary transmission antenna 7. Auxiliary energy is emitted at an auxiliary frequency f' by the auxiliary transmission antenna 7. A part of the auxiliary energy emitted by the auxiliary transmission antenna 7 is received by an auxiliary reception antenna 8 and is likewise supplied to the non-linear reactance 10 unmodified, i.e., unamplified. The auxiliary transmission antenna 7 and the auxiliary reception antenna 8 preferably are resonant at the auxiliary frequency f'.

The auxiliary frequency f' is considerably higher than the magnetic resonance frequency f, such as a multiple of the magnetic resonance frequency. It should amount to at least five times the magnetic resonance frequency f but not fall below three times the magnetic resonance frequency f under any circumstances. Values that lie between ten and fifteen times the magnetic resonance frequency f have proven useful in practice.

Figure 3:
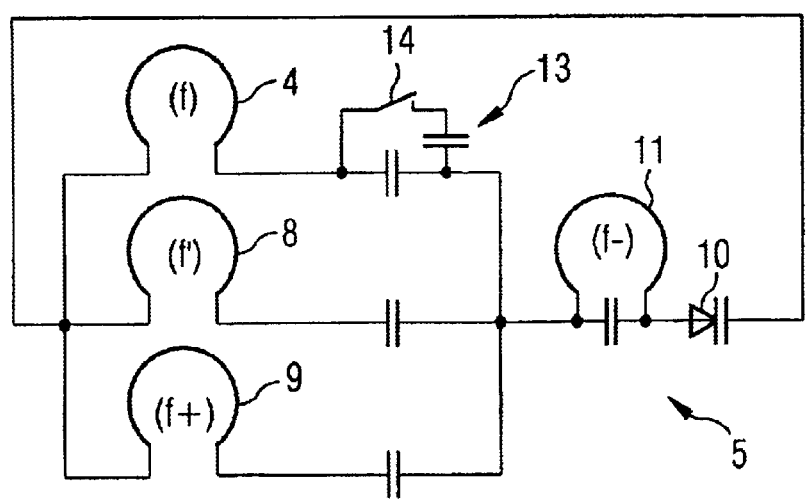

In the embodiment of FIG. 2, the magnetic resonance reception antenna 4 and the auxiliary reception antenna 8 as well as a mixed frequency transmission antenna 9 are fashioned as parallel resonant circuits and are connected in series with one another. In the embodiment of FIG. 3, the magnetic resonance reception antenna 4 and the auxiliary reception antenna 8 as well as the mixed frequency transmission antenna 9 are fashioned as series resonant circuits and connected in parallel.

The non-linear reactance 10 is connected in parallel with the series or parallel circuit of the three antennas 4, 8, 9. As shown in FIGS. 2 and 3, it is fashioned as a varactor. The non-linear reactance 10 mixes the part of the auxiliary energy supplied to it and the magnetic resonance signal supplied to it to form a mixed signal having a mixed frequency f+. The mixed frequency f+ is thereby equal to the sum of the magnetic resonance frequency f and the auxiliary frequency f'. The reception arrangement 5 is thus fashioned as a reactance up-mixer or parametric up-converter.

When mixing the auxiliary energy and the magnetic resonance signal, the non-linear reactance 10 also generates a supplemental signal with a supplemental frequency f−. The supplemental frequency f− is equal to the difference between the auxiliary frequency f' and the magnetic resonance frequency f. The supplemental signal is supplied to an acceptor circuit 11. The acceptor circuit 11 is resonant at the supplemental frequency f−. It is fashioned as a series resonant circuit and is connected in parallel with the non-linear reactance 10 in FIG. 2. As indicated (with broken lines) in FIG. 3, however, it can be alternatively fashioned as a parallel resonant circuit and connected in series with the non-linear reactance 10.

The mixed signal is supplied to the mixed signal transmission antenna 9, and the mixed signal transmission antenna 9 emits it unmodified, i.e., unamplified. The mixed signal transmission antenna 9 preferably is resonant at the mixed frequency f+. A part of the emitted mixed signal is received by a mixed signal reception antenna 12 and is supplied to the control and evaluation device 1. The control and evaluation device 1 in turn regenerates the magnetic resonance signal from the mixed signal and evaluates it.

According to FIGS. 2 and 3, the magnetic resonance reception antenna 4 has a capacitance 13 the value of which is controllable, for example via a switch 14. The switch 14 is driven by a detector arrangement 15 that is coupled to the auxiliary reception antenna 8.

The detector device 15 can detect whether the auxiliary reception antenna 8 is receiving auxiliary energy. When this is the case, the magnetic resonance reception antenna 4 is tuned by the detector device 15 so that it is resonant at the magnetic resonance frequency f. When, in contrast, the detector device 15 detects no reception of auxiliary energy, the magnetic resonance reception antenna 4 is tuned (detuned) such that it is not resonant at the magnetic resonance frequency f.

According to FIG. 4, blocking elements 16 are arranged between the magnetic resonance transmission antenna 2 and the auxiliary transmission antenna 7. A uniform binary control signal S is supplied directly to the blocking element 16 that precedes the magnetic resonance transmission antenna 2. The blocking element 16 that precedes the auxiliary transmission antenna 7, in contrast, is supplied with the control signal S via a negation element 17. As a result, the magnetic resonance transmission antenna 2 and the auxiliary transmission antenna 7 are necessarily locked relative to one another. At any arbitrary point in time, thus, at most one of them can emit a signal.

Due to the locking of the magnetic resonance transmission antenna 2 and the auxiliary transmission antenna 7 relative to one another, the detector device 15 tunes the magnetic resonance reception antenna 4 to the magnetic resonance frequency f only when the magnetic resonance transmission antenna 2 is not emitting a magnetic resonance excitation signal. The reception arrangement 5 and the magnetic resonance reception antenna 4 are thus protected against damage.

The reception arrangement 5 does not have an energy source of its own. The energy supply of the reception arrangement 5 ensues exclusively via the auxiliary reception antenna 8. Nonetheless, a locally received magnetic resonance signal can be wirelessly communicated to the control and evaluation device 1 in a simple way by means of the present invention. This is especially possible because the distances between the auxiliary transmission antenna 7 and the auxiliary reception antenna 8 as well as between the mixed signal transmission antenna 9 and the mixed signal reception antenna 12 are relatively small. As a rule, the distances are notably less than one meter.

Insofar as described above, the magnetic resonance system has a single reception arrangement 5, a single auxiliary transmission antenna 7 and a single mixed signal reception antenna 12. A number of such components can be present, however, when the auxiliary frequencies f' and the mixed frequencies f+ resulting from the auxiliary frequencies f' and the magnetic resonance frequency f are selected such that the individual auxiliary and mixed signal frequencies f', f+ do not mutually influence one another.

As shown in FIG. 5, it is even possible to exit an auxiliary signal via a single broadband auxiliary transmission antenna 7, this auxiliary signal having a number of different auxiliary frequencies f'1, f'2, f'3. The auxiliary signal can be received by a single broadband auxiliary reception antenna 8. It is supplied to mixer arrangements 18 via input filter circuits 6. The input filter circuits 6 are respectively tuned to the auxiliary frequencies f'1, f'2, f'3.

The mixer arrangements 18 each contain a magnetic resonance reception antenna 4 that is resonant at the magnetic resonance frequency f. Each also includes a non-linear reactance 10 that is again preferably fashioned as a varactor. The mixer arrangement 18 can also include acceptor circuits 11 that are resonant at the corresponding supplemental frequencies f−1, f−2, f−3. For clarity, the acceptor circuits 11 are not shown in FIG. 5.

The mixed signals generated by the non-linear reactances 10 have the corresponding sum frequencies f+1, f+2, f+3. These signals are supplied via output filter circuits 6' to a broadband mixed signal transmission antenna 9 that emits the mixed signals. The output filter circuits 6' are respectively tuned to the mixed frequencies f+1, f+2, f+3.

The mixed signals emitted by the mixed signal antenna 9 are received by a broadband mixed signal reception antenna 12 and are divided onto individual evaluation branches via a frequency filters 19.

The arrangement according to FIG. 5 thus enables a simple communication of magnetic resonance signals that are received by array coils.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for communicating a magnetic resonance signal from a magnetic resonance reception antenna to an evaluation device, comprising the steps of:
   receiving a magnetic resonance signal with a magnetic resonance reception antenna at a magnetic resonance frequency;
   supplying said magnetic resonance signal from said magnetic resonance reception antenna, without amplification, to a parametric up-converter having non-linear reactance;
   emitting auxiliary energy from an auxiliary transmission antenna at an auxiliary frequency;
   receiving a part of said auxiliary energy with an auxiliary reception antenna;
   supplying a signal representing said auxiliary energy at said auxiliary frequency from said auxiliary reception antenna to said parametric up-converter without amplification;
   in said parametric up-converter, using said non-linear reactance, to amplify and mix said signal representing said auxiliary energy and said magnetic resonance signal to form a mixed signal having a mixed frequency equal to a sum of said magnetic resonance frequency and said auxiliary frequency;
   supplying said mixed signal from said parametric up-converter to a mixed signal transmission antenna without amplification between said parametric up-converter and said mixed signal transmitter antenna, and emitting said mixed signal from said mixed signal transmission antenna; and
   receiving at least a part of said mixed signal with a mixed signal reception antenna and supplying said mixed signal from said mixed signal reception antenna to an evaluation device.

2. A method as claimed in claim 1 comprising the additional step of:
   in said non-linear reactance, also generating a supplemental signal at a supplemental frequency equal to a difference between said auxiliary frequency and said magnetic resonance frequency; and
   supplying said supplemental signal to an acceptor circuit that is resonant at said supplemental frequency.

3. A method as claimed in claim 1 wherein said auxiliary transmission antenna emits said auxiliary energy at an auxiliary frequency that is substantially higher than said magnetic resonance frequency.

4. A method as claimed in claim 1 comprising the additional step of tuning said magnetic resonance reception antenna to said magnetic resonance frequency only when said auxiliary reception antenna is receiving said auxiliary energy.

5. A reception arrangement for receiving a magnetic resonance signal, comprising:
   a magnetic resonance reception antenna that receives a magnetic resonance signal at a magnetic resonance frequency;
   a parametric up-converter, having non-linear reactance, connected to said magnetic resonance reception antenna that receives said magnetic resonance signal at said magnetic resonance frequency from said magnetic resonance reception antenna without amplification;
   an auxiliary reception antenna which receives auxiliary energy at an auxiliary frequency, said auxiliary reception antenna being connected to said non-linear reactance and supplying a signal representing said auxiliary energy at said auxiliary frequency to said non-linear reactance;
   said parametric up-converter, by means of said non-linear reactance, amplifying and mixing said signal representing said auxiliary energy and said magnetic resonance signal to form a mixed signal having a mixed frequency equal to a sum of said magnetic resonance frequency and said auxiliary frequency; and
   a mixed signal transmission antenna connected to said parametric up-converter and supplied with said mixed signal at said mixed signal frequency without amplification between said parametric up-converter and said mixed signal transmission antenna, said mixed signal transmission antenna emitting said mixed signal.

6. A reception arrangement as claimed in claim 5 wherein said magnetic resonance reception antenna, said auxiliary reception antenna and said mixed signal reception antenna each form a parallel resonant circuit, the respective parallel resonant circuits being connected in series with each other.

7. A reception arrangement as claimed in claim 6 wherein said non-linear reactance is connected in parallel with said series connection of the respective parallel resonant circuits.

8. A reception arrangement as claimed in claim 5 wherein said magnetic resonance reception antenna, said auxiliary reception antenna and said mixed signal transmission antenna each form a series resonant circuit, the respective series resonant circuits being connected in parallel.

9. A reception arrangement as claimed in claim 8 wherein said non-linear reactance is connected in parallel with said parallel connection of the respective series resonant circuits.

10. A reception arrangement as claimed in claim 5 further comprising an acceptor circuit, connected with said non-linear reactance, said acceptor circuit being resonant at a frequency equal to a difference between said auxiliary frequency and said magnetic resonance frequency.

11. A reception arrangement as claimed in claim 5 wherein said non-linear reactance is a varactor.

12. A reception arrangement as claimed in claim 5 wherein said auxiliary reception antenna receives said auxiliary energy at an auxiliary frequency that is substantially higher than said magnetic resonance frequency.

13. A reception arrangement as claimed in claim 5 further comprising a detector device connected to said auxiliary reception antenna and to said magnetic resonance reception antenna, said detector device detecting when said auxiliary reception antenna is receiving said auxiliary energy and tuning said magnetic resonance reception antenna to resonate at said magnetic resonance frequency only when said auxiliary reception antenna is receiving said auxiliary energy.

14. A magnetic resonance system comprising:

a magnetic resonance reception antenna that receives a magnetic resonance signal at a magnetic resonance frequency;

an auxiliary transmission antenna that emits auxiliary energy at an auxiliary frequency;

an up-converter, having a non-linear reactance, connected to said magnetic resonance reception antenna that receives said magnetic resonance signal at said magnetic resonance frequency from said magnetic resonance reception antenna without amplification;

an auxiliary reception antenna which receives said auxiliary energy at said auxiliary frequency, said auxiliary reception antenna being connected to said up-converter and supplying a signal representing said auxiliary energy at said auxiliary frequency to said up-converter without amplification;

said up-converter by means of said non-linear reactance, amplifying and mixing said signal representing said auxiliary energy and said magnetic resonance signal to form a mixed signal having a mixed frequency equal to a sum of said magnetic resonance frequency and said auxiliary frequency;

a mixed signal transmission antenna connected to said up-converter and supplied with said mixed signal at said mixed signal frequency without amplification between said up-converter and said mixed signal transmission antenna, and said mixed signal transmission antenna emitting said mixed signal;

a mixed signal reception antenna which receives at least a part of said mixed signal; and an evaluation device connected to said mixed signal reception antenna supplied with a part of the mixed signal received by the mixed signal reception antenna, said evaluation device evaluating said part of said mixed signal.

15. A magnetic resonance system as claimed in claim 14 comprising a magnetic resonance transmission antenna that emits a magnetic resonance excitation signal at said magnetic resonance frequency, said magnetic resonance transmission antenna and said auxiliary transmission antenna being locked relative to each other.

* * * * *